United States Patent
Eussen

(10) Patent No.: US 7,136,148 B2
(45) Date of Patent: Nov. 14, 2006

(54) LITHOGRAPHIC APPARATUS AND DEVICE MANUFACTURING METHOD

(75) Inventor: Emiel Jozef Melanie Eussen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 139 days.

(21) Appl. No.: 11/019,522

(22) Filed: Dec. 23, 2004

(65) Prior Publication Data

US 2006/0139586 A1 Jun. 29, 2006

(51) Int. Cl.
*G03B 27/42* (2006.01)

(52) U.S. Cl. .................. 355/53; 355/72; 355/75; 250/492.2; 356/400

(58) Field of Classification Search ............. None
See application file for complete search history.

(56) References Cited

U.S. PATENT DOCUMENTS 6,233,040 B1 * 5/2001 Sekiguchi ............... 355/53
6,727,977 B1   4/2004 Butler
2005/0168754 A1 * 8/2005 Hill ....................... 356/500

* cited by examiner

*Primary Examiner*—D. Rutledge
(74) *Attorney, Agent, or Firm*—Pillsbury Winthrop Shaw Pittman, LLP

(57) ABSTRACT

A lithographic apparatus includes an illumination system configured to condition a radiation beam, and a support structure constructed to support a patterning device. The patterning device imparts the radiation beam with a pattern in its cross-section to form a patterned radiation beam. A substrate table is constructed to hold a substrate, and a projection system projects the patterned radiation beam onto a target portion of the substrate. An interferometer system measures a position of the substrate table, and generates a disturbance frequency by optical feedback. A position control system controls the position of the support structure and the substrate table on the basis of the position measurement of the interferometer system. The position control system selects a substrate table speed to prevent a positioning error due to the disturbance frequency.

17 Claims, 3 Drawing Sheets

LITHOGRAPHIC APPARATUS AND DEVICE MANUFACTURING METHOD

FIELD

The present invention relates to a lithographic apparatus, and to a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that circumstance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, a mask is placed on a mask table, or reticle stage RS, and moved by a positioner under the control of a motion control system. Similarly, a substrate is placed on a substrate table, or wafer stage WS, and moved by a positioner under the control of the motion control system. The movements of the reticle stage RS and the wafer stage WS are coordinated in order to irradiate the desired target portion of the substrate with the desired pattern from the mask. In general, the projection system has a magnification factor M (which generally is <1), and therefore the speed at which the wafer stage WS is scanned will be a factor M times the speed at which the reticle stage RS is scanned. Since wafer stage WS errors tend to be larger than reticle stage RS errors due to, inter alia, on-the-fly levelling actions, the remaining position error $e_{ws}$ of the wafer stage WS is coupled feedforward to the reticle stage RS to result in a feedthrough factor $e_{wrs}/e_{ws}$ (wafer stage to reticle stage position error in relation to wafer stage position error) which may be optimized as disclosed in U.S. Pat. No. 6,727,977, which is incorporated herein by reference. An additional benefit is that reticle stage RS positioning errors only contribute by a factor of M to an imaging error.

Conventionally, to overcome the delay in the feedthrough, a feedthrough may be optimized for frequencies lower than a threshold frequency, in this particular case 300–350 Hz. However, this improvement of the feedthrough factor for lower frequencies is obtained at the cost of a larger high-frequency gain. Thus, higher frequencies are amplified, and may disturb the overall system performance to generate MSD (Moving Standard Deviation) errors resulting in severe loss of imaging performance on the substrate.

SUMMARY

It is desirable to reduce the impact of a small wafer stage WS error on the overall system performance.

According to an embodiment of the invention, there is provided a lithographic apparatus including an illumination system configured to condition a radiation beam; a support structure constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; an interferometer system configured to measure a position of the substrate table, the interferometer system generating a disturbance frequency by optical feedback, a position control system configured to control the position of the support structure and the substrate table on the basis of the position measurement of the interferometer system, wherein the position control system is configured to select a substrate table speed to prevent a positioning error due to the disturbance frequency.

According to an embodiment of the invention, there is provided a lithographic apparatus, including: an illumination system configured to condition a radiation beam; a support structure constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; an interferometer system for measuring a position of the substrate table at a sampling frequency, the interferometer system generating a disturbance frequency by optical feedback, a position control system configured to control the position of the support structure and the substrate table on the basis of the position measurement of the interferometer system, the position control system including a control path from a substrate table position controller to a support structure position controller for a substrate table position error, wherein a difference between the substrate table position error and a support structure position error is smaller than the substrate table position error for frequencies below a threshold frequency, wherein the position control system is configured to select a substrate table speed such that the sampled disturbance frequency does not exceed the threshold frequency.

According to an embodiment of the invention, the position control system is configured to select substrate table speed such that the sampled disturbance frequency is equal to the threshold frequency.

According to an embodiment of the invention, there is provided a device manufacturing method, including transferring a pattern from a patterning device onto a substrate, the method including: supporting the patterning device by a support structure; holding the substrate on a substrate table measuring a position of the substrate table by an interferometer system, the interferometer system generating a disturbance frequency by optical feedback, controlling the position of the support structure and the substrate table on the basis of the position measurement of the interferometer system, selecting a substrate table speed to prevent a positioning error due to the disturbance frequency.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
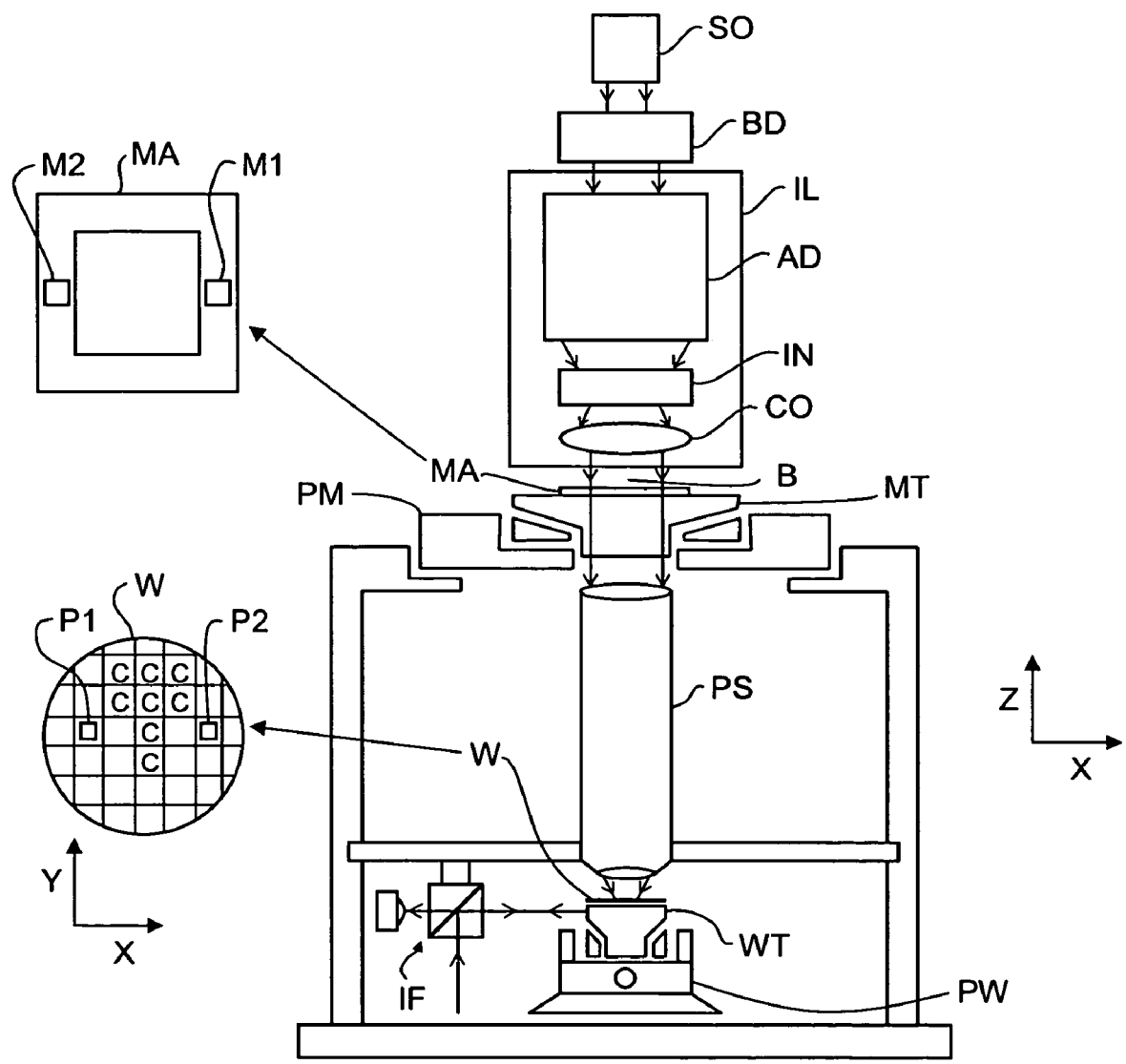
FIG. 1 schematically illustrates a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation), and a support structure (e.g. a mask table) MT constructed to support a patterning device (e.g. a mask) MA and connected to a first positioner PM configured to accurately position the patterning device in accordance with certain parameters. The apparatus also includes a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

Step mode: the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the following, a control system behavior is explained in connection with an exemplary control system of a lithographic apparatus. It is to be observed, however, that various other control systems may be used.

Higher frequencies, which may disturb the overall system performance to generate MSD (Moving Standard Deviation), errors may be generated through imperfections in a laser interferometer system used to measure the position of the wafer stage WS. In the interferometer system, a polarizing beamsplitter may be used to split up light originating from a laser in different measurement beams. Each measurement beam travels twice to the stage (two passes). However, if an optical imperfection of the interferometer consists of an optical leakage of an optical component thereof, such as the polarizing beamsplitter, light will be reflected back to the laser. This so-called optical feedback is mainly returning from the first pass to the stage (although it may also be the result of multiple passes). Since, in the case of a single pass, the optical feedback has traveled one time to the stage, the frequency of the optical feedback will be modulated by the speed of the stage. The laser output will be disturbed by this modulation, which causes small measurement errors, in the order of nanometer.

As an example, assuming a stage speed of 0.32 m/s, the disturbance frequency will be 1010800 Hz. After being aliased due to a sampling frequency of 2.5 kHz (the frequency range of the measurement system being 0–1250 Hz), a remaining disturbance is left at 800 Hz. This disturbance cannot be followed by the wafer stage WS, and is coupled to the reticle stage RS via the feedthrough. Since the frequency of the disturbance is considerably higher than 300 Hz, the error may be amplified such that it causes very large MSD errors at the reticle stage RS. Therefore, a small wafer stage WS error may cause a large wafer stage to reticle stage (WS-RS) error.

Figure 2:
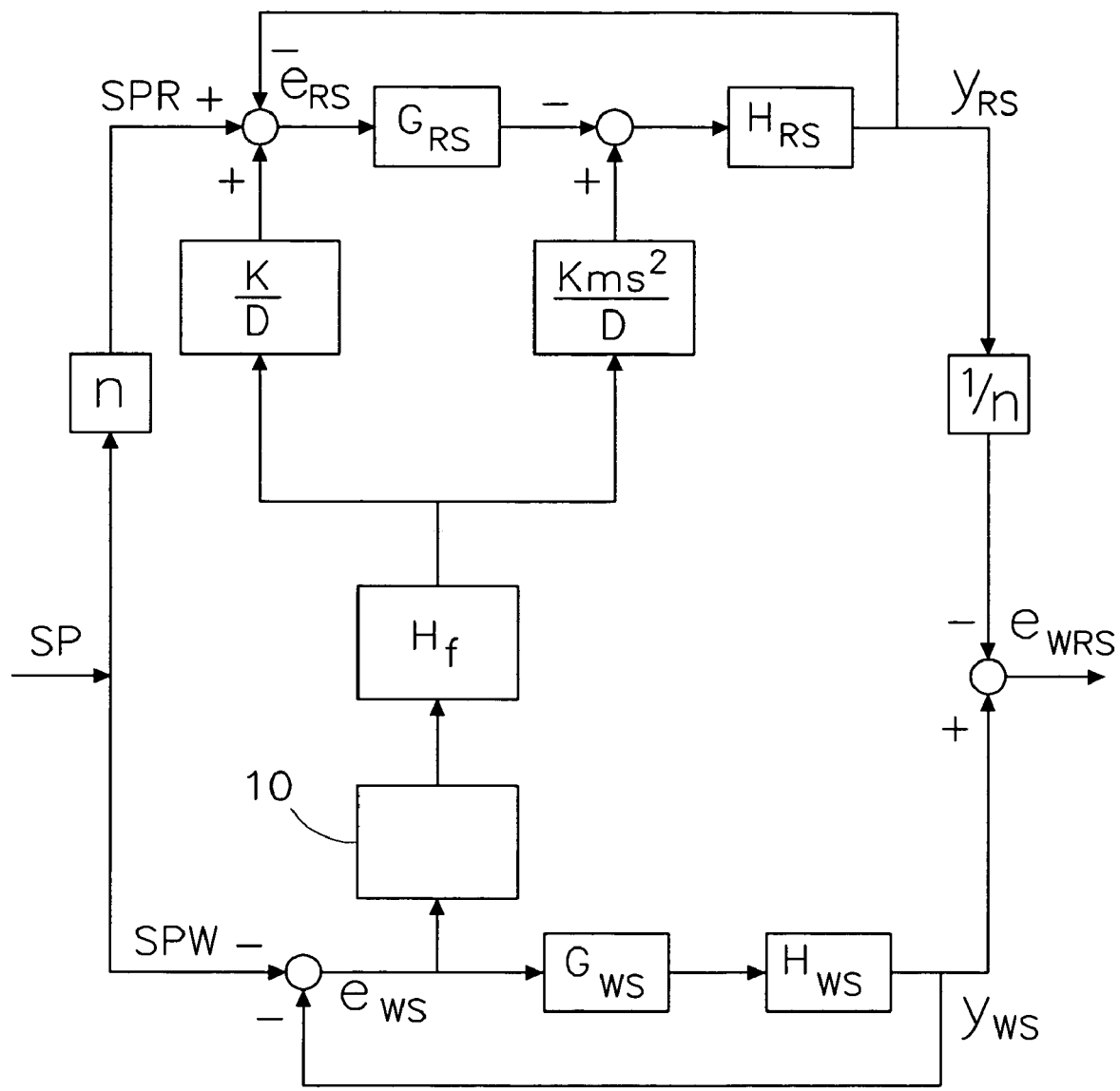
FIG. 2 represents a conventional control theory circuit.

FIG. 2 depicts a control theory diagram of a control system which may be used in an apparatus according to the invention. The top loop represents the mask table (or reticle stage) RS, consisting of the mechanical transfer $H_{RS}$ and controller $G_{RS}$. The bottom loop is the substrate table (or wafer stage) WS, consisting of the mechanical transfer $H_{ws}$ and controller $G_{ws}$. The mask table receives a setpoint SPR which is n times the setpoint SPW of the substrate table, while its output only counts 1/n in the relevant WS/RS error, reflecting the fact that the pattern image is projected by the projection system PL with a magnification M=1/n and that the mask table scans at n times the speed of the substrate.

Via a predictor 10 the substrate table error $e_{ws}$ is added to the mask table setpoint SPR, and a substrate table acceleration error is generated. This error is combined with the output of the mask table controller GRS so that an extra force is generated which, when applied to the mask stage, should give it n times the acceleration of the substrate table. When applied on its own, the mask table controller GRS would consider this force a disturbance, and would react and try to diminish the effect of the feedforward. By additionally feeding the predicted substrate table error $e_{ws}$ to the mask table setpoint, this problem is solved. Now, if the mask table reacts to the extra feedforward force as a transfer 1/ms², the mask stage error $e_{RS}$ remains zero and hence the mask stage controller is left "unaware" of any extra force injection. In FIG. 2, Hf represents one or more filters that may be used to refine the output of the predictor 10, and blocks 14 and 16 each represent a low-pass filter.

Figure 3:
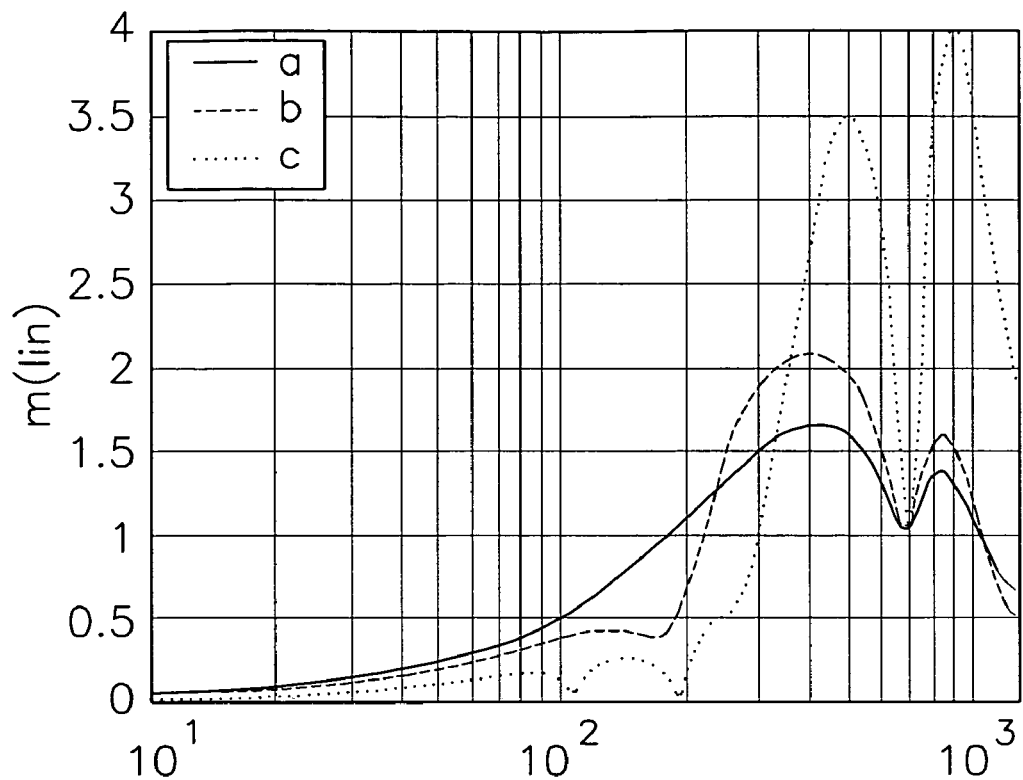
FIG. 3 is a graph of feedthrough factors of the control system of FIG. 2 and of two other conventional control systems.

FIG. 3 shows the feedthrough factor $e_{WRS}/e_{WS}$. In this Figure, 0 is ideal while values below 1 denote an improvement and values above 1 denote a degradation. As can be seen in the Figure, the use of the predictor according to graph c may improve the feedthrough factor (compared to conventional feedthrough factors according to graphs a and b) at frequencies up to a threshold frequency, in this case 350 Hz (graph c), while the feedthrough factor is degraded at higher frequencies (graph c).

Thus, an optimum control system behavior is obtained at frequencies of the wafer stage error not exceeding a threshold frequency.

Figure 4:
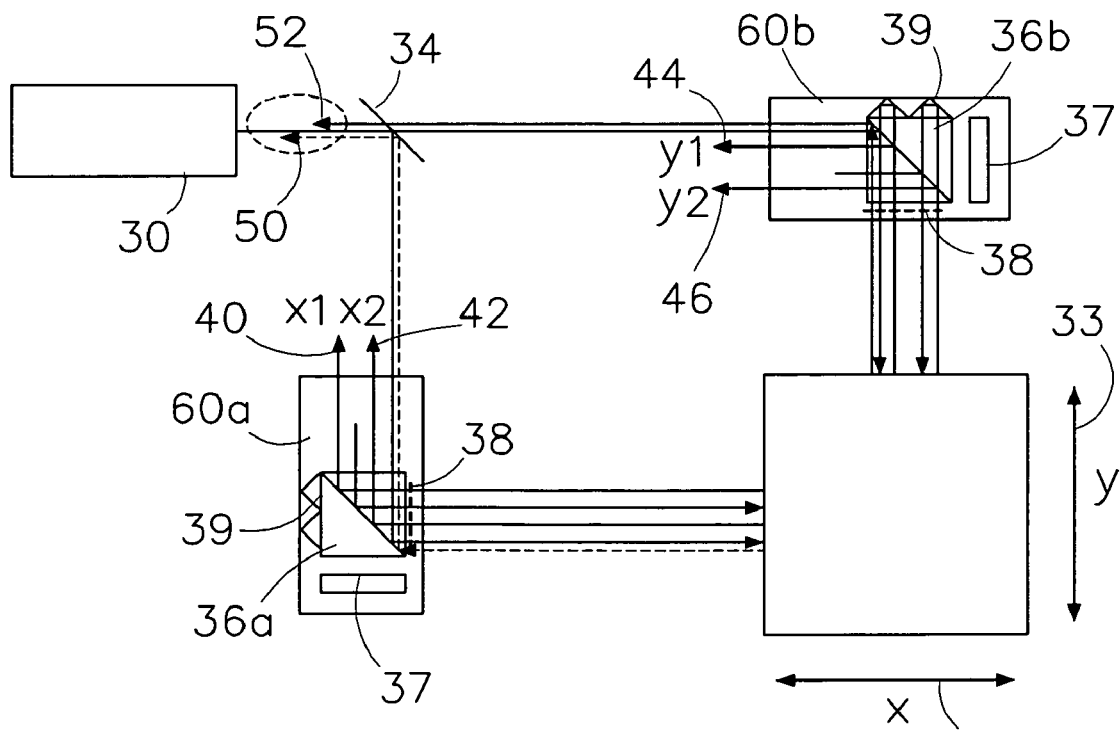
FIG. 4 schematically illustrates a laser interferometer position measurement system for explaining an optical feedback phenomenon.

FIG. 4 shows a laser 30 and interferometers 60a, 60b including polarizing beamsplitters 36a, 36b, reference mirrors 37, quarterwave plates 38, and retroreflectors 39, for measuring the position of a stage 32 with an interferometer system. A laser beam emitted by the laser 30 partially is reflected by a mirror 34 and is directed to the interferometer 60a. In the interferometer 60a, the (partial) beam may or may not be split up in a number of beams each forming a measurement axis (two beams are shown in the Figure, whereas normally one or more measurement beams are used) 40, 42. Each beam travels twice to the stage 32 to measure the position of the stage 32 in an x-direction 31. Similarly, the laser beam emitted by the laser 30 partially passes the mirror 34 and is directed to the interferometer 60b. In the interferometer 60b, the (partial) beam may or may not be split up in a number of beams each forming a measurement axis (two beams are shown in the Figure, whereas normally one or more measurement beams are used) 44, 46. Each beam travels twice to the stage 32 to measure the position of the stage 32 in a y-direction 33.

If there is an optical leakage in the optical path after the first pass of the beam, some light will go back to the laser directly. As an illustration, an imperfection in a quarter wave plate 38 may cause a polarization offset in the returning beam of the first pass, and after the polarizing beamsplitter this may result in a small optical term being reflected back to the laser. This so-called optical feedback has traveled one time to the stage 32, and its frequency will be modulated by the speed of the stage. Optical feedback is indicated by the beams 50 and 52. Consequently, this modulation will disturb the laser output, and cause measurement errors of the interferometer system.

The disturbance frequency may be calculated from the following relationship:

$$f = \frac{2 \cdot v_b}{\lambda_{air}}$$

in which:

f disturbance frequency [Hz]

$v_b$ (partial) stage speed in the direction of the laser beam [m/s]

$\lambda_{air}$ wavelength in air [m]

The disturbance frequency is sampled with a sample frequency $f_s$ of the position control system, so that a frequency of the error signal $e_{WS}$ is (f modulo $f_s$). When the error signal frequency is kept below the threshold frequency as explained above, the control system behavior is improved.

As an example, assuming a stage speed $v_b$ of 320.00 mm/s, the disturbance frequency will be 1010800 Hz. With a sampling frequency $f_s$ of 2.5 kHz, the error signal frequency is (1010800 modulo 2500)=800 Hz, which is well above a threshold frequency of 300 Hz. However, if an error signal frequency below the threshold frequency is desired, e.g. 200 Hz, the speed $v_b$ of the wafer stage may be changed from 320.00 mm/s to 319.68 mm/s or 319.81 mm/s or 320.47 mm/s or 320.60 mm/s etc. Thus, a small change in wafer stage speed reduces the impact of interferometer system component imperfections on positioning of the stages of the lithographic apparatus.

This is principally different from the prior art where, typically, the error signal frequency would have been chosen to be above the servo bandwidth of the stage actuators to suppress the influence thereof.

As will be clear from the above, the nominal scan speed of the wafer stage can be chosen such that the disturbance caused by imperfections in the optical path(s) of the interferometer system has little or no impact on the control system performance, without significantly affecting the magnitude of the speed of the wafer stage or other parameters (e.g. dose) of the lithographic apparatus. When the speed of the wafer stage is chosen to be at the threshold frequency, the measuring error sustains, and the position control system does not follow the error. At other speeds, the error increases or decreases.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
an illumination system configured to condition a radiation beam;

a support structure constructed to support a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate;

an interferometer system configured to measure a position of the substrate table, and a position control system configured to control the position of the support structure and the substrate table on the basis of the position measurement of the interferometer system, wherein said position control system is configured to select a substrate table speed to prevent a positioning error due to a disturbance frequency generated by optical feedback in the interferometer system.

2. The lithographic apparatus of claim 1, wherein said position control system is configured to sample the disturbance frequency with a sample frequency so as to generate a frequency of the substrate table error signal that is substantially equal to f modulo fs, where f is the disturbance frequency and fs is the sample frequency.

3. The lithographic apparatus of claim 2, wherein said disturbance frequency is substantially equal to $(2*v_b)/\lambda_{air}$, where $v_b$ is the table speed and $\lambda_{air}$ is the wavelength of radiation used by said interferometer system.

4. The lithographic apparatus of claim 2, wherein said sample frequency is about 2.5 kHz.

5. The lithographic apparatus of claim 2, wherein said frequency of the substrate table error signal is lower than a threshold frequency.

6. The lithographic apparatus of claim 5, wherein said threshold frequency is about 300 Hz.

7. A lithographic apparatus comprising:

an illumination system configured to condition a radiation beam;

a support structure constructed to support a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate;

an interferometer system for measuring a position of the substrate table at a sampling frequency, a position control system configured to control the position of the support structure and the substrate table on the basis of the position measurement of the interferometer system, the position control system comprising a control path from a substrate table position controller to a support structure position controller for a substrate table position error, wherein a difference between the substrate table position error and the support structure position error is smaller than the substrate table position error for frequencies below a threshold frequency, wherein said position control system is configured to select a substrate table speed such that a sampled disturbance frequency generated by optical feedback in the interferometer system does not exceed said threshold frequency.

8. The lithographic apparatus of claim 7, wherein said threshold frequency is about 300 Hz.

9. The lithographic apparatus of claim 7, wherein the position control system is configured to select a substrate table speed such that the sampled disturbance frequency is equal to said threshold frequency.

10. The lithographic apparatus of claim 9, wherein said disturbance frequency is substantially equal to $(2*v_b)\lambda_{air}$, where $v_b$ is the table speed and $\lambda_{air}$ is the wavelength of radiation used by said interferometer system.

11. A device manufacturing method, comprising:

transferring a pattern from a patterning device onto a substrate;

supporting the patterning device with a support structure;

holding the substrate on a substrate table;

measuring a position of the substrate table with an interferometer system;

controlling the position of the support structure and the substrate table on the basis of the position measurement of the interferometer system, and selecting a substrate table speed to prevent a positioning error due to a disturbance frequency generated by optical feedback in the interferometer system.

12. The method of claim 11, wherein said selecting includes sampling said disturbance frequency with a sample frequency so as to generate a frequency of the substrate table error signal that is substantially equal to f modulo fs, where f is the disturbance frequency and fs is the sample frequency.

13. The method of claim 11, wherein said disturbance frequency is substantially equal to $(2*v_b)\lambda_{air}$, where $v_b$ is the table speed and $\lambda_{air}$ is the wavelength of radiation used by said interferometer system.

14. A device manufacturing method, comprising:

transferring a pattern from a patterning device onto a substrate;

supporting the patterning device with a support structure;

holding the substrate on a substrate table;

measuring a position of the substrate table by an interferometer system at a sampling frequency;

controlling the position of the support structure and the substrate table on the basis of the position measurement of the interferometer system, the position control system comprising a control path from a substrate table position controller to a support structure position controller for a substrate table position error, wherein a difference between the substrate table position error and a support structure position error is smaller than the substrate table position error for frequencies below a threshold frequency, and selecting a substrate table speed such that a sampled disturbance frequency generated by optical feedback in said interferometer system does not exceed said threshold frequency.

15. The method of claim 14, wherein a substrate table speed is selected such that the sampled disturbance frequency is substantially equal to said threshold frequency.

16. The method of claim 14, wherein said threshold frequency is about 300 Hz.

17. The method of claim 14, wherein said disturbance frequency is substantially equal to $(2*v_b)\lambda_{air}$, where $v_b$ is the table speed and $v_b$ is the wavelength of radiation used by said interferometer system.

* * * * *